United States Patent
Choi (10) Patent No.: US 10,177,212 B2
(45) Date of Patent: Jan. 8, 2019

(54) ORGANIC ELECTROLUMINESCENT DISPLAY DEVICE

(71) Applicant: LG Display Co., Ltd., Seoul (KR)

(72) Inventor: Heedong Choi, Seosan-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/716,335

(22) Filed: Sep. 26, 2017

(65) Prior Publication Data

US 2018/0090554 A1    Mar. 29, 2018

(30) Foreign Application Priority Data

Sep. 29, 2016    (KR) .................... 10-2016-0125535

(51) Int. Cl.
    *H01L 27/32*    (2006.01)
    *H01L 51/52*    (2006.01)

(52) U.S. Cl.
    CPC ...... *H01L 27/3279* (2013.01); *H01L 27/3246* (2013.01); *H01L 27/3258* (2013.01); *H01L 51/5228* (2013.01); *H01L 51/5237* (2013.01)

(58) Field of Classification Search
    CPC . H01L 27/32; H01L 27/3279; H01L 27/3246; H01L 51/5228; H01L 51/5237
    See application file for complete search history.

(56) References Cited

U.S. PATENT DOCUMENTS

| | | | |
|---|---|---|---|
| 2006/0125390 A1* | 6/2006 | Oh | H01L 27/3276 313/506 |
| 2008/0191603 A1* | 8/2008 | Kubota | H01L 51/5228 313/498 |
| 2014/0131693 A1* | 5/2014 | Masumoto | G09F 9/00 257/40 |
| 2014/0346448 A1 | 11/2014 | You et al. | |
| 2015/0179719 A1 | 6/2015 | Nam et al. | |
| 2016/0035813 A1 | 2/2016 | Lee et al. | |
| 2017/0288167 A1* | 10/2017 | Hanari | H01L 51/5243 |

FOREIGN PATENT DOCUMENTS

| | | |
|---|---|---|
| JP | 2008-216975 A | 9/2008 |
| KR | 10-2015-0033345 A | 4/2015 |

OTHER PUBLICATIONS

European Extended Search Report, European Application No. 17193651.1, dated Feb. 19, 2018, 9 pages.

* cited by examiner

*Primary Examiner* — Phuc Dang
(74) *Attorney, Agent, or Firm* — Fenwick & West LLP

(57) ABSTRACT

Disclosed herein is an electroluminescent display device capable of improving reliability of a contact portion between low-potential supply line and a cathode electrode of an organic light emitting diode. The electroluminescent display device includes a low potential voltage supply line disposed on a display panel to supply a low potential voltage to the display panel; a cathode electrode overlapped with the low potential voltage supply line and having at least one contact portion; and an auxiliary cathode electrode overlapped with the low potential voltage supply line and the cathode electrode to connect the low potential voltage supply line to the cathode electrode, wherein a bank layer is disposed between the cathode electrode and the auxiliary cathode electrode to cover a rim of the auxiliary cathode electrode, or the cathode electrode covers a rim of the auxiliary cathode electrode and an inorganic insulation layer.

8 Claims, 4 Drawing Sheets

ORGANIC ELECTROLUMINESCENT DISPLAY DEVICE

CROSS-REFERENCE TO RELATED APPLICATION

This disclosure claims the benefit of priority under 35 U.S.C. § 119(a) to Republic of Korea Patent Application No. 10-2016-0125535 filed on Sep. 29, 2016, the entire contents of which is incorporated herein by reference in its entirety.

BACKGROUND

Field of Technology

This disclosure relates to an organic electroluminescent display device, and more particularly to an organic electroluminescent display device capable of improving reliability of a contact portion between low-potential supply line and a cathode electrode of an organic light emitting diode.

Discussion of the Related Art

Recently, various flat panel display devices capable of reducing weight and volume, which are disadvantages of CRT (Cathode Ray Tube), have been developed. The flat panel display devices may be a liquid crystal display device (LCD), a field emission display device (FED), a plasma display panel (PDP), an organic electroluminescent display device and so on.

The organic electroluminescent display is a self-emissive display device which excites an organic compound to emit light. It does not require a backlight used in the LCD, so its thickness and weight can be reduced and can simplify the process. Also, the organic electroluminescent display device is widely used because it can be manufactured at low temperature, has a high response speed of 1 ms or less, and has properties such as a low power consumption, a wide viewing angle, and a high contrast.

The organic electroluminescent display device includes an organic light emitting diode (OLED) that converts electric energy into light energy. The organic light emitting diode includes an anode electrode, a cathode electrode, and an organic light emitting layer disposed between the anode electrode and the cathode electrode. Holes are injected from the anode electrode and electrons are injected from the cathode electrode. An exciton is generated when the holes are injected into the organic light emitting layer through the anode electrode and the electrons are injected into the organic light emitting layer through the cathode electrode. The excitons emit light while emitting energy.

The organic electroluminescent display device comprises gate lines, data lines, common power lines, and pixels defined by their crossings. Each pixel includes a switching thin film transistor, a driving thin film transistor, a storage capacitor, and an organic light emitting diode. The switching thin film transistor is turned on when a scan pulse is supplied to the gate line to supply the data signal supplied to the data line to the storage capacitor and a gate electrode of the driving thin film transistor. The driving thin film transistor controls the current supplied from a power supply line to the organic light emitting diode in response to the data signal supplied to the gate electrode, thereby controlling the amount of light emission from the organic light emitting diode. The storage capacitor charges the data supplied from the data line through the switching thin film transistor so that the driving thin film transistor can maintain the emission of the organic light emitting diode by supplying a constant current until the data signal of the next frame is supplied even if the switching thin film transistor is turned off.

Hereinafter, a related art organic electroluminescent display device will be described with reference to FIG. 1.

Figure 1:
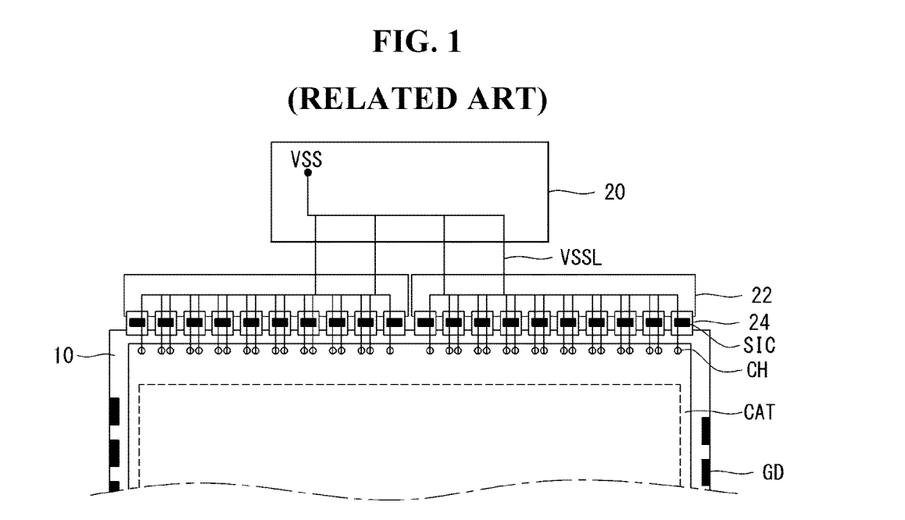
FIG. 1 is a cross-sectional view schematically showing a organic electroluminescent display device according to the related art.

FIG. 1 is a cross-sectional view showing a part of a related art organic electroluminescent display device.

Referring to FIG. 1, a related art organic electroluminescent display device includes a display panel 10, a control PCB 20, source PCBs 22, gate drivers GD, and chip-on films 24.

The chip-on films 24 are electrically connected to pads of the source PCBs 22 and data pads of the display panel 10. On the chip-on film 24, a source integrated circuit (hereinafter, referred to as a source IC) SIC as a source driver circuit is mounted.

The source PCB 22 is provided with various wirings for supplying digital video data, timing control signals and power supply voltages required for the display panel from the control PCB 20.

A control circuit and a data transfer circuit are mounted on the control PCB 20. The control PCB 20 supplies the timing control signals for controlling the operation of the source ICs SIC together with the digital video data and the power supply voltages to the source ICs SIC of the chip-on films 24 through the source PCBs 22.

In FIG. 1, signal lines for supplying timing control signals, data signals and so on, a supply line for supplying a high-potential voltage, and the like are omitted in order to avoid complication of the drawing. Only a low potential voltage supply line VSSL for supplying a low potential voltage VSS to the cathode electrode CAT of the organic electroluminescent display device is shown.

In the related art organic electroluminescent display device, the low potential voltage VSS is supplied to the cathode electrode CAT formed on the display panel through the control PCB 20, the source PCBs 22 and the source ICs SIC as shown in FIG. 1.

Low potential voltage supply lines VSSL for supplying the low potential voltage VSS are connected to the cathode electrode CAT via the control PCB 20, the source PCBs 22 and the chip-on film 24.

The low potential voltage supply lines VSSL are formed when the gate lines are formed in the display panel 10 the organic electroluminescent display device in order to reduce the number of process steps, and the cathode electrode CAT is formed when the organic light emitting diodes are formed after forming the data lines. As a result, the low potential voltage supply lines VSSL and the cathode electrode CAT are formed in different layers. Accordingly, in order to connect the low potential voltage supply lines VSSL and the cathode electrode CAT to each other, a plurality of contact holes CH must be formed in layers existing between them.

In this construction, there are an insulation layer covering the low potential voltage supply lines VSSL, a first auxiliary cathode electrode formed on the insulation layer on which the source/drain electrodes of the thin film transistor arranged in the display area (active area) of the display panel are formed, a passivation layer covering the first auxiliary cathode electrode, an overcoat layer for planarization disposed on the passivation layer, and a second auxiliary cathode electrode formed on the passivation layer on which the pixel electrodes are arranged between the low potential voltage supply lines VSSL and the cathode electrode CAT. In the contact areas between the low potential power supply voltage lines VSSL and the cathode electrode CAT, the first auxiliary cathode electrode is connected to the low potential voltage supply lines VSSL via through-holes passing through the insulating layer. Also, the passivation layer and the overcoat layer on the low voltage supply lines VSSL are removed so that the first and second auxiliary cathode electrodes are directly connected, and the cathode electrode is disposed on the second auxiliary cathode electrode.

However, when the cathode electrode is disposed on the second auxiliary cathode electrode, there is a lifting phenomenon between the second auxiliary cathode electrode and the second auxiliary cathode electrode because the second auxiliary cathode electrode formed of a transparent conductive material such as indium tin oxide (ITO) and the overcoat layer formed of the organic insulating material disposed thereunder are not in good contact with each other. For this reason, when the second auxiliary cathode electrode is etched, the end portion of the second auxiliary cathode electrode may have a reverse tapered shape.

Therefore, when the cathode electrode is formed on the second auxiliary cathode electrode, a hole is formed in the cathode electrode or a thickness of the cathode electrode is thin due to the reverse tapered shape of the second auxiliary cathode electrode, and the resistance of the portion corresponding to the reverse tapered shape becomes higher. Therefore, when the display panel is driven for a long time, there is a problem that the display panel is damaged.

SUMMARY

An object of this disclosure is to provide an organic electroluminescent display device capable of preventing the inverse tapered shape from being generated at the rim of the second auxiliary cathode electrode which is in contact with the cathode electrode, thereby preventing the damage of the display panel.

An organic electroluminescent display device according to one aspect of this disclosure comprises a low potential voltage supply line disposed on a non-display area of a display panel to supply a low potential voltage to the display panel; a cathode electrode overlapped with the low potential voltage supply line and having at least one contact portion; and an auxiliary cathode electrode overlapped with the low potential voltage supply line and the cathode electrode to connect to the low potential voltage supply line, wherein a bank layer is disposed between the cathode electrode and the auxiliary cathode electrode to cover a rim of the auxiliary cathode electrode when the rim of the auxiliary cathode electrode is disposed on the organic insulation layer at the contact portion of the cathode electrode, and wherein the cathode electrode covers a rim of the auxiliary cathode electrode and an inorganic insulation layer when the rim of the auxiliary cathode electrode is disposed on the inorganic insulation layer at the contact portion of the cathode electrode.

The auxiliary cathode electrode includes a first auxiliary cathode electrode connected to the low potential voltage supply line exposed through a plurality of contact holes passing through an insulation layer covering the low potential voltage supply line; and a second auxiliary cathode electrode disposed on the first auxiliary cathode electrode exposed through the inorganic insulation layer and the organic insulation layer sequentially covering the first auxiliary cathode electrode.

The inorganic insulation layer and the organic insulation layer includes a first opening to expose the first auxiliary cathode electrode, the second auxiliary cathode electrode is disposed on the first auxiliary cathode electrode, the inorganic insulation layer, and the organic insulation layer exposed through the first opening, the bank layer is disposed on the organic insulation layer to cover the rim of the second auxiliary cathode electrode, and the cathode electrode is disposed on the organic insulation layer to cover the bank layer and the second auxiliary cathode electrode.

The inorganic insulation layer and the organic insulation layer includes a first opening to expose the first auxiliary cathode electrode, the organic insulation layer includes a second opening disposed at a distance from the first opening and exposing the inorganic layer, the second auxiliary cathode electrode is disposed on the first auxiliary cathode electrode exposed through the first opening, a portion of the inorganic insulation layer exposed through the second opening, and the organic insulation layer between the first opening and second opening, and the cathode electrode disposed on the organic insulation layer to cover the second auxiliary cathode electrode, and cover the rim of the second auxiliary cathode electrode in the second opening.

An organic electroluminescent display device according to another aspect of this disclosure comprises a low potential voltage supply line disposed on a substrate; a first auxiliary cathode electrode disposed on an insulation layer covering the low potential voltage supply line, and connected to the low potential voltage supply line through a plurality of contact holes exposing the low potential voltage supply line; a passivation layer and an overcoat layer sequentially covering the first auxiliary cathode electrode; a second auxiliary cathode electrode disposed on the first auxiliary cathode electrode, the passivation layer and the overcoat layer exposed through an opening passing through the passivation layer and the overcoat layer; a bank layer disposed on the overcoat layer and the second auxiliary cathode electrode to cover a rim of the auxiliary cathode electrode; and a cathode electrode disposed on the overcoat layer to cover the bank layer and the second auxiliary cathode electrode.

An organic electroluminescent display device according to another aspect of this disclosure comprises a low potential voltage supply line disposed on a substrate; a first auxiliary cathode electrode disposed on an insulation layer covering the low potential voltage supply line, and connected to the low potential voltage supply line through a plurality of contact holes exposing the low potential voltage supply line; a passivation layer and an overcoat layer sequentially covering the first auxiliary cathode electrode; a second auxiliary cathode electrode disposed on the first auxiliary cathode electrode, the passivation layer and the overcoat layer exposed through a first opening passing through the passivation layer and the overcoat layer, and on a portion of the passivation layer exposed through a second opening disposed at a distance from the first opening and exposing the passivation layer; and a cathode electrode disposed on the overcoat layer and the passivation layer to cover the bank layer and the second auxiliary cathode electrode.

The passivation layer is made of an inorganic insulation material and the overcoat layer is made of an organic insulation layer.

According to the organic electroluminescent display device of this disclosure, since the reverse tapered shape does not occur at the edge portion of the auxiliary cathode electrode disposed between the cathode electrode and the low-potential voltage supply lines, it is possible for the display panel to be prevented from being damaged due to an increase in resistance even when the display panel is driven for a long time.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Hereinafter, embodiments of this disclosure are described in detail with reference to the accompanying drawings. In the specification, the same reference symbols denote the same elements. In the following description, a detailed description of the known functions and constitutions will be omitted if it is deemed to obscure the embodiments of the present invention. Furthermore, the names of elements used in the following description have been selected by taking into consideration only the ease of writing this specification and may be different from the names of actual parts.

Hereinafter, an organic electroluminescent display according to an embodiment of this disclosure will be described with reference to FIGS. 2 and 3.

Figure 2:
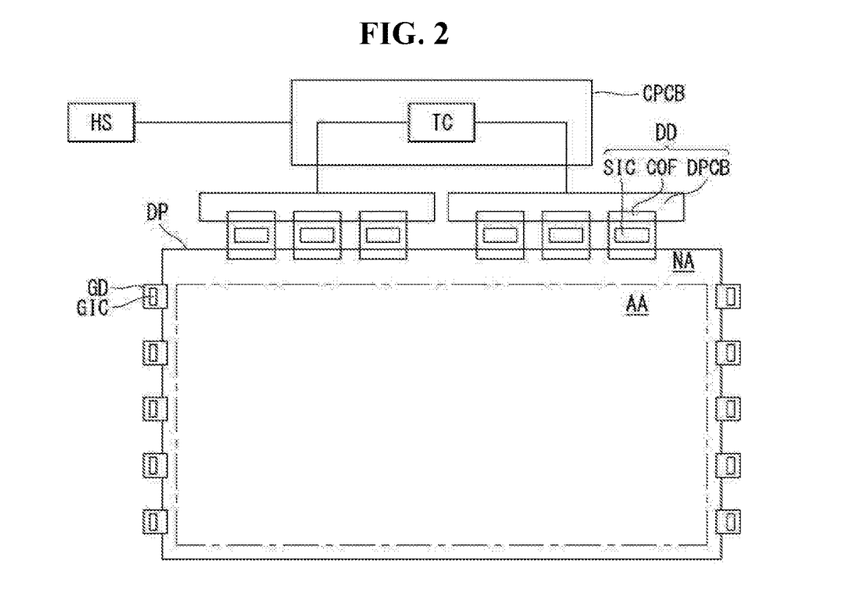
FIG. 2 is a block diagram schematically showing an organic electroluminescent display according to an embodiment of the disclosure.

FIG. 2 is a block diagram schematically showing an organic electroluminescent display according to an embodiment of this disclosure. FIG. 3 is an equivalent circuit diagram schematically showing one pixel region of the display panel of the organic electroluminescent display device shown in FIG. 2.

Figure 3:
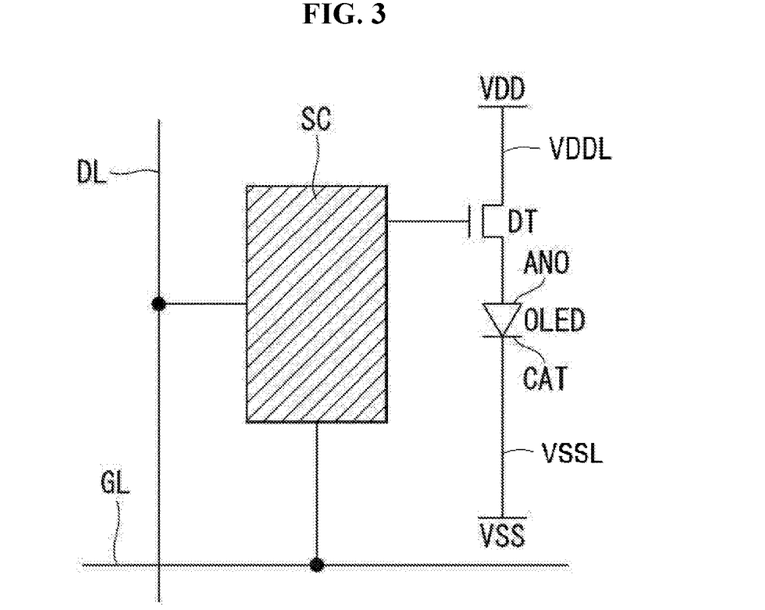
FIG. 3 is an equivalent circuit diagram schematically showing one pixel region of the display panel of the organic electroluminescent display device shown in FIG. 2 according to an embodiment of the disclosure.

Referring to FIGS. 2 and 3, the organic light emitting display according to this disclosure includes a display panel DP, data drivers DD disposed on one side of the display panel DP, gate drivers GD disposed on another side of the display panel DP, a timing controller TC providing timing signals to the data drivers DD and the gate drivers GD, a high potential voltage supply line VDDL for supplying a high potential voltage to the display panel DP, and a low potential voltage supply line VSSL for supplying a low potential voltage to the display panel DP.

The data driver DD on which the source IC SIC is mounted has one side connected to one end of the source printed circuit board DPCB, and another side connected to one end of the display panel DP.

The data driver DD converts the digital video data RGB input from the timing controller TC into an analog gamma compensation voltage to generate a data voltage. The data voltage output from the data driver DD is supplied to the data lines DL.

The gate driver GD includes a gate IC GIC, and sequentially supplies gate pulses synchronized with the data voltage to the gate lines GL to select pixels of the display panel DP to which the data voltage is written.

The timing controller TC receives timing signals, such as a vertical sync signal Vsync, a horizontal sync signal Hsync, a data enable signal DE, and a main clock MCLK, from a host system HS and synchronizes the operating timing of the data driver DD and the gate driver GD. Data timing control signals for controlling the data driver DD include a source sampling clock SSC, a source output enable signal SOE and so on. Gate timing control signals for controlling the gate driver GD include a gate start pulse GSP, a gate shift clock GSC, a gate output enable signal GOE and so on. The timing controller TC may be mounted on the control PCB CPCB.

The host system HS may be implemented as any one of a TV system, a set-top box, a navigation system, a DVD player, a blue-ray player, a personal computer (PC), a home theater system, or a phone system. The host system HS transmits the timing signals Vsync, Hsync, DE, and MCLK, together with digital video data, to the timing controller TC.

The pixel array of the display panel DP includes pixels defined by the data lines DL and the gate lines GL. Each of the pixels includes an organic light-emitting diode which is a self-emitting element.

Referring to FIG. 3, in the display panel DP, the plurality of data lines DL and the plurality of gate lines GL are crossing over each other, and pixels are disposed in a matrix form neighboring to the crossings. Each of the pixels includes an organic light-emitting diode OLED, a driving thin film transistor DT for controlling the amount of current flowing into the organic light-emitting diode OLED, and a programming unit SC for setting the gate-source voltage of the driving thin film transistor DT.

The programming unit SC may include at least one switching thin film transistor and at least one storage capacitor.

The switching thin film transistor is turned on in response to a scan signal from the gate line GL, and applies a data voltage from the data line DL to an electrode on one electrode of the storage capacitor.

The driving thin film transistor DT adjusts the amount of light emitted by the organic light-emitting diode OLED by controlling the amount of current supplied to the organic light-emitting diode OLED based on the amount of a voltage charged in the storage capacitor. The amount of light emitted by the organic light-emitting diode OLED is proportional to the amount of current supplied by the driving thin film transistor DT.

Each of the pixels is connected to a high potential voltage source VDD and a low potential voltage source VSS, and is supplied with a high potential voltage and a low potential voltage from a power generation unit (not shown).

The thin film transistors constituting the pixel may be implemented in a p type or an n type. Furthermore, the semiconductor layer of the thin film transistors constituting the pixel may include amorphous silicon, polysilicon, or oxide. The organic light-emitting diode OLED includes an anode electrode ANO, a cathode electrode CAT, and an organic emission layer interposed between the anode electrode ANO and the cathode electrode CAT. The anode electrode ANO is connected to the driving thin film transistor DT. The organic emission layer includes an emission layer (EML). The organic emission layer may be disposed between a hole injection and hole transport layers and an electron transport and electron injection layers.

Hereinafter, an electroluminescent display device according to a first embodiment of this disclosure will be described in more detail with reference to FIGS. 4 to 6.

Figure 4:
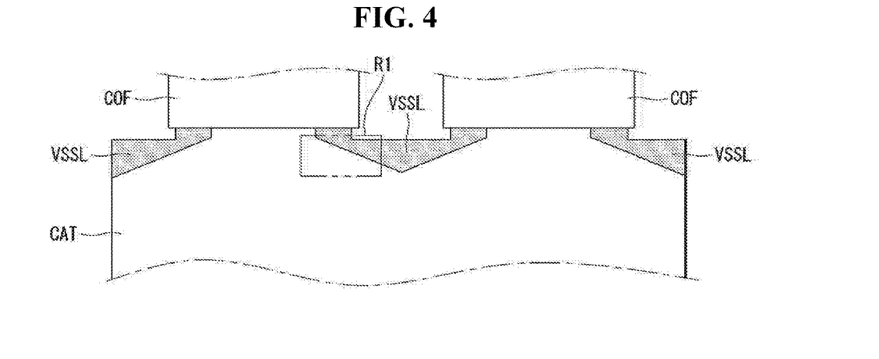
FIG. 4 is a plan view showing a portion of organic electroluminescent display devices according to embodiments of the disclosure.

FIG. 4 is a plan view showing a portion of organic electroluminescent display devices according to embodiments of this disclosure. FIG. 5 is a plan view showing a first embodiment of an area R1 shown in FIG. 4. FIG. 6 is a cross-sectional view taken along line I-I' of FIG. 5.

Referring to FIG. 4, the electroluminescent display device according to a first embodiment of this disclosure a low potential voltage supply line VSSL for supplying a low potential voltage VSS through the chip-on film COF, and a cathode electrode CAT connected to the low potential voltage supply line VSSL.

In FIG. 4, signal lines for supplying timing control signals such as data signals, a high potential voltage supply line for supplying a high potential voltage and so on are omitted to obviate complicating the drawing, but the cathode electrode CAT and the low potential voltage supply line VSSL for supplying the low potential voltage VSS to the cathode electrode CAT are shown.

Figure 5:
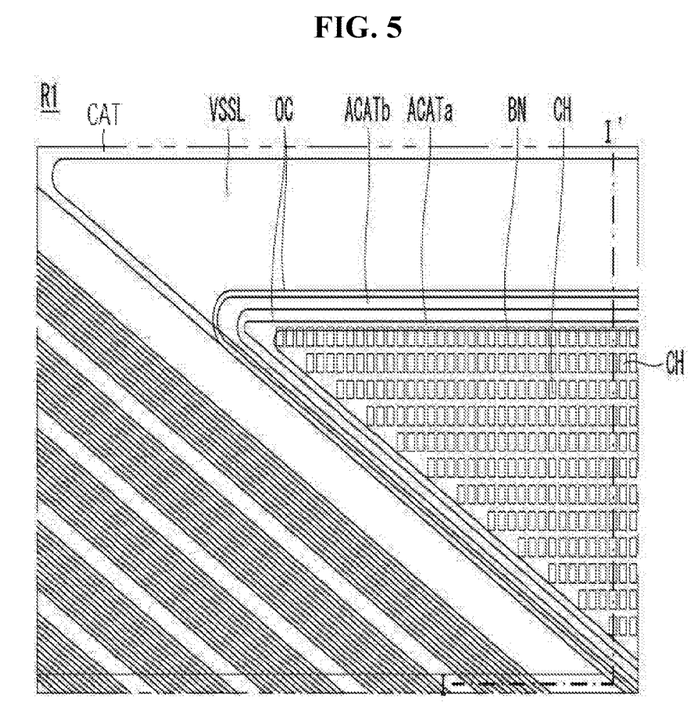
FIG. 5 is a plan view showing a first embodiment of an area R1 shown in FIG. 4 according to an embodiment of the disclosure.
Figure 6:
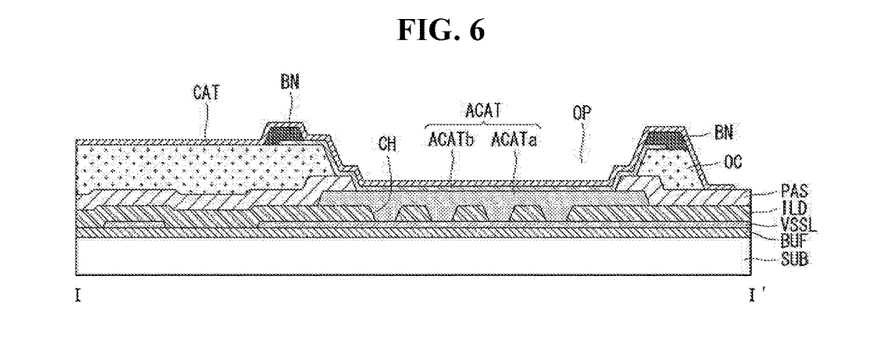
FIG. 6 is a cross-sectional view taken along line I-I' of FIG. 5 according to an embodiment of the disclosure.

Referring to FIGS. 5 and 6 showing an area R1 of FIG. 4, the low potential voltage supply line VSSL is connected to the cathode electrode CAT through a first auxiliary cathode electrode ACATa and a second auxiliary cathode electrode ACATb. Hereinafter, the connection structure of the low potential voltage supply line VSSL and the cathode electrode CAT will be described in more detail.

A buffer layer BUF is disposed on a substrate SUB of the display panel DP. A low potential voltage supply line VSSL is disposed on the buffer layer BUF. The buffer layer BUF may be omitted.

An insulation layer ILD is disposed on the buffer layer BUF to cover the low potential voltage supply line VSSL.

The first auxiliary cathode electrode ACATa is disposed on the insulation layer ILD to be connected to the low potential voltage supply line VSSL exposed through a plurality of contact holes CH of the insulating layer ILD.

A passivation layer PAS is disposed on the insulating layer ILD to cover the first auxiliary cathode electrode ACATa. An overcoat layer OC is disposed on the passivation layer PAS to flatten the passivation layer PAS. The passivation layer PAS may be formed of an inorganic insulating material, and the overcoat layer OC may be formed of an organic insulating material. The passivation layer PAS and the overcoat layer OC have an opening OP exposing the first auxiliary cathode electrode ACATa.

A second auxiliary cathode electrode ACATb is disposed on the overcoat layer OC to be in contact with the first auxiliary cathode electrode ACATa exposed through the opening OP. The second auxiliary cathode electrode ACATb is also disposed on the passivation layer PAS and the overcoat layer OC as well as the first auxiliary cathode electrode ACATa exposed through the opening OP.

A bank layer BN is disposed on a rim of the second auxiliary cathode electrode ACATb and the overcoat layer OC so that the rim of the second auxiliary cathode electrode ACATb is not exposed to the outside.

A cathode electrode CAT of the organic light emitting diode is disposed on the overcoat layer OC on which the second auxiliary cathode electrode ACATb and the bank layer BN are disposed to cover the second auxiliary cathode electrode ACATb and the bank layer BN.

According to the construction described above, since the bank layer BN covers the rim of the second auxiliary cathode electrode ACATb, when the cathode electrode CAT is formed in a subsequent process, the cathode electrode CAT is in contact with the second auxiliary cathode electrode ACATb at a position inside the second auxiliary cathode electrode ACATb, not at the rim of the second auxiliary cathode electrode ACATb.

According to the organic light emitting diode display according to the first embodiment of this disclosure, since the cathode electrode CAT is in contact with the second auxiliary cathode electrode ACATb while avoiding the rim of the second auxiliary cathode electrode ACATb in which a reverse taper shape may be formed, it is possible to prevent a damage of the display panel due to the increase of resistance even when the display panel is driven for a long time.

Hereinafter, an electroluminescent display device according to a second embodiment of this disclosure will be described in more detail with reference to FIGS. 4, 7 and 8.

FIG. 4 is a plan view showing a portion of organic electroluminescent display devices according to embodiments of this disclosure. FIG. 7 is a plan view showing a second embodiment of the area R1 shown in FIG. 4. FIG. 8 is a cross-sectional view taken along line II-II' of FIG. 7.

Figure 7:
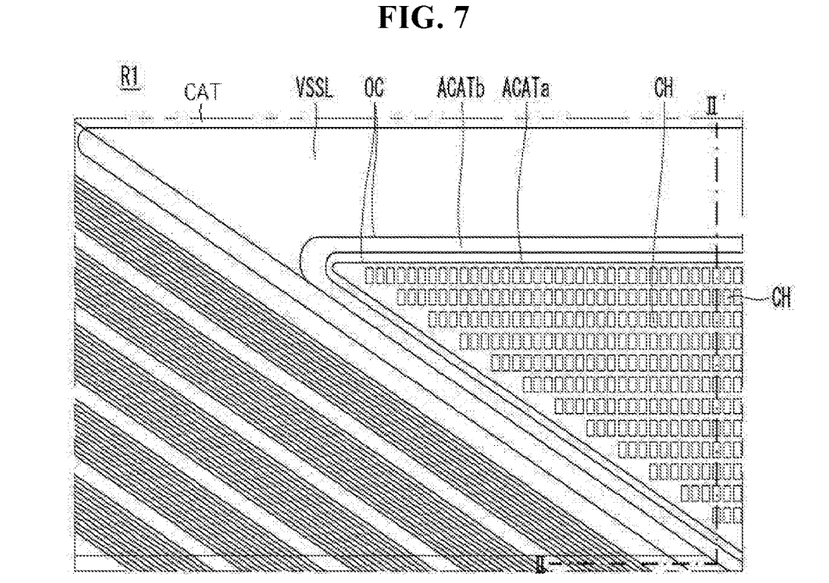
FIG. 7 is a plan view showing a second embodiment of the area R1 shown in FIG. 4 according to an embodiment of the disclosure.
Figure 8:
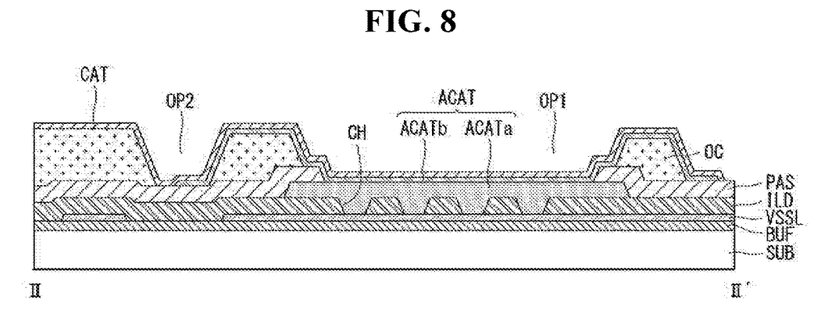
FIG. 8 is a cross-sectional view taken along line II-II' of FIG. 7 according to an embodiment of the disclosure.

Referring to FIGS. 7 and 8 of the second embodiment showing an area R1 of FIG. 4, the low potential voltage supply line VSSL is connected to the cathode electrode CAT through a first auxiliary cathode electrode ACATa and a second auxiliary cathode electrode ACATb. Hereinafter, the connection structure of the low potential voltage supply line VSSL and the cathode electrode CAT will be described in more detail.

A buffer layer BUF is disposed on a substrate SUB of the display panel DP. A low potential voltage supply line VSSL is disposed on the buffer layer BUF. The buffer layer BUF may be omitted.

An insulation layer ILD is disposed to cover the low potential voltage supply line VSSL.

The first auxiliary cathode electrode ACATa is disposed on the insulation layer ILD so as to be connected to the low potential voltage supply line VSSL exposed through a plurality of contact holes CH of the insulation layer ILD.

A passivation layer PAS is disposed on the insulation layer ILD to cover the first auxiliary cathode electrode ACATa. An overcoat layer OC is disposed on the passivation layer PAS to flatten the passivation layer PAS. The passivation layer PAS may be formed of an inorganic insulating material, and the overcoat layer OC may be formed of an organic insulating material. The passivation layer PAS and the overcoat layer OC have a first opening OP1 exposing the first auxiliary cathode electrode ACATa. The overcoat layer OC has a second opening OP2 exposing.

A second auxiliary cathode electrode ACATb is disposed on the overcoat layer OC to be in contact with the first auxiliary cathode electrode ACATa exposed through the first opening OP1. The second auxiliary cathode electrode ACATb is disposed on partial areas of the passivation layer PAS and the overcoat layer OC as well as the first auxiliary cathode electrode ACATa exposed through the first opening OP1. The second auxiliary cathode electrode ACATb is also disposed on a portion of the passivation layer PAS exposed through the second opening OP2.

A cathode electrode CAT of the organic light emitting diode is disposed on the overcoat layer OC on which the second auxiliary cathode electrode ACATb is disposed to cover the second auxiliary cathode electrode ACATb.

According to the construction described above, the rim of the second auxiliary cathode electrode ACATb is disposed on the passivation layer PAS, and the passivation layer PAS is formed of an inorganic insulating material. Since an adhesive property between the second auxiliary cathode electrode ACATb and the passivation layer PAS is good, there is no reverse tapered shapes which may be generated at the rim of the second auxiliary cathode electrode ACATb which is in contact with the cathode electrode CAT when forming the cathode electrode CAT in the subsequent process.

According to the organic light emitting diode display according to the second embodiment of this disclosure, since there are no reverse tapered shapes at the rim of the second auxiliary cathode electrode ACATb, it is possible to prevent a damage of the display panel due to the increase of resistance even when the display panel is driven for a long time.

Those skilled in the art will understand that the present invention may be changed and modified in various ways without departing from the technical spirit of this disclosure through the aforementioned contents. Accordingly, the technical scope of this disclosure is not limited to the contents described in the detailed description of the specification, but should be determined by the claims.

What is claimed is:

1. An electroluminescent display device comprising:
   a low potential voltage supply line disposed on a non-display area of a display panel to supply a low potential voltage to the display panel;
   a cathode electrode overlapped with the low potential voltage supply line and having at least one contact portion; and
   an auxiliary cathode electrode overlapped with the low potential voltage supply line and the cathode electrode to connect the low potential voltage supply line to the cathode electrode,
   wherein a bank layer is disposed between the cathode electrode and the auxiliary cathode electrode to cover a rim of the auxiliary cathode electrode when the rim of the auxiliary cathode electrode is disposed on an organic insulation layer at the contact portion of the cathode electrode, and
   wherein the cathode electrode covers the rim of the auxiliary cathode electrode and an inorganic insulation layer when the rim of the auxiliary cathode electrode is disposed on the inorganic insulation layer at the contact portion of the cathode electrode.

2. The electroluminescent display device of claim 1, wherein the auxiliary cathode electrode includes:
   a first auxiliary cathode electrode connected to the low potential voltage supply line exposed through a plurality of contact holes passing through an insulation layer covering the low potential voltage supply line; and
   a second auxiliary cathode electrode disposed on the first auxiliary cathode electrode exposed through the inorganic insulation layer and the organic insulation layer sequentially covering the first auxiliary cathode electrode.

3. The electroluminescent display device of claim 2, wherein the inorganic insulation layer and the organic insulation layer include a first opening to expose the first auxiliary cathode electrode,
   wherein the second auxiliary cathode electrode is disposed on the first auxiliary cathode electrode, the inorganic insulation layer, and the organic insulation layer exposed through the first opening,
   wherein the bank layer is disposed on the organic insulation layer to cover the rim of the second auxiliary cathode electrode, and
   wherein the cathode electrode is disposed on the organic insulation layer to cover the bank layer and the second auxiliary cathode electrode.

4. The electroluminescent display device of claim 2, wherein the inorganic insulation layer and the organic insulation layer include a first opening to expose the first auxiliary cathode electrode,
   wherein the organic insulation layer includes a second opening disposed at a distance from the first opening and exposes the inorganic layer,
   wherein the second auxiliary cathode electrode is disposed on the first auxiliary cathode electrode exposed through the first opening, a portion of the inorganic insulation layer exposed through the second opening, and the organic insulation layer between the first opening and second opening, and
   wherein the cathode electrode is disposed on the organic insulation layer to cover the second auxiliary cathode electrode, and cover the rim of the second auxiliary cathode electrode in the second opening.

5. An electroluminescent display device comprising:
   a low potential voltage supply line disposed on a substrate;
   a first auxiliary cathode electrode disposed on an insulation layer covering the low potential voltage supply line, and connected to the low potential voltage supply line through a plurality of contact holes exposing the low potential voltage supply line;
   a passivation layer and an overcoat layer sequentially covering the first auxiliary cathode electrode;
   a second auxiliary cathode electrode disposed on the first auxiliary cathode electrode, the passivation layer and the overcoat layer exposed through an opening passing through the passivation layer and the overcoat layer;
   a bank layer disposed on the overcoat layer and the second auxiliary cathode electrode to cover a rim of the auxiliary cathode electrode; and
   a cathode electrode disposed on the overcoat layer to cover the bank layer and the second auxiliary cathode electrode.

6. An electroluminescent display device comprising:
   a low potential voltage supply line disposed on a substrate;
   a first auxiliary cathode electrode disposed on an insulation layer covering the low potential voltage supply line, and connected to the low potential voltage supply line through a plurality of contact holes exposing the low potential voltage supply line;
   a passivation layer and an overcoat layer sequentially covering the first auxiliary cathode electrode;
   a second auxiliary cathode electrode disposed on the first auxiliary cathode electrode, the passivation layer and the overcoat layer exposed through a first opening passing through the passivation layer and the overcoat layer, and on a portion of the passivation layer exposed through a second opening disposed at a distance from the first opening and exposing the passivation layer; and
   a cathode electrode disposed on the overcoat layer and the passivation layer to cover the bank layer and the second auxiliary cathode electrode.

7. The electroluminescent display device of claim 5, wherein the passivation layer is made of an inorganic insulation material and the overcoat layer is made of an organic insulation layer.

8. The electroluminescent display device of claim 6, wherein the passivation layer is made of an inorganic insulation material and the overcoat layer is made of an organic insulation layer.

\* \* \* \* \*